United States Patent
Panozzo et al.

(10) Patent No.: US 8,564,306 B2
(45) Date of Patent: Oct. 22, 2013

(54) SYSTEM AND METHOD FOR EVALUATING A WIRE CONDUCTOR

(75) Inventors: Edward Panozzo, Mokena, IL (US); Harold Parish, Shelby Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 526 days.

(21) Appl. No.: 12/950,796

(22) Filed: Nov. 19, 2010

(65) Prior Publication Data
US 2012/0126822 A1    May 24, 2012

(51) Int. Cl.
*G01R 31/02* (2006.01)
(52) U.S. Cl.
CPC .................................... *G01R 31/021* (2013.01)
USPC ............................. 324/543; 324/517; 324/541
(58) Field of Classification Search
None
See application file for complete search history.

(56) References Cited

U.S. PATENT DOCUMENTS 5,514,966 A * 5/1996 Kawamura et al. ........... 324/539

* cited by examiner

*Primary Examiner* — Paresh Patel
(74) *Attorney, Agent, or Firm* — Quinn Law Group, PLLC

(57) ABSTRACT

A method of evaluating an electrically conductive wire segment having an insulated intermediate portion and non-insulated ends includes passing the insulated portion of the wire segment through an electrically conductive brush. According to the method, an electrical potential is established on the brush by a power source. The method also includes determining a value of electrical current that is conducted through the wire segment by the brush when the potential is established on the brush. The method additionally includes comparing the value of electrical current conducted through the wire segment with a predetermined current value to thereby evaluate the wire segment. A system for evaluating an electrically conductive wire segment is also disclosed.

19 Claims, 2 Drawing Sheets

SYSTEM AND METHOD FOR EVALUATING A WIRE CONDUCTOR

STATEMENT REGARDING FEDERALLY SPONSORED RESEARCH OR DEVELOPMENT

This invention was made with U.S. Government support under an Agreement/Project number: DE-EE0002629, awarded by the United States Department of Energy. The United States Government may have certain rights in this invention.

TECHNICAL FIELD

The invention relates to a system and a method for evaluating a wire conductor.

BACKGROUND

Wire is typically formed by drawing a metal substrate through an aperture in a die or draw plate. Wire is often reduced to the desired diameter and properties by repeated drawing through progressively smaller dies. After a number of passes the wire may be annealed either to facilitate more drawing or, if the drawn wire already exhibits the desired diameter, to maximize the wire's ductility and electrical conductivity.

Wire is commonly used for making internal connections inside electrical or electronic devices. Based on ductility and electrical conductivity requirements, the metals suitable for such wire are mainly platinum, silver, iron, copper, aluminum and gold. Wire is typically formed from such metals and their alloys, the most common of which are brass and bronze. A wire used for such a purpose may be solid or multi-stranded, and is often covered with a dielectric or insulating material such as plastic, rubber-like polymer or varnish.

SUMMARY

A method of evaluating an electrically conductive wire segment having an insulated intermediate portion and non-insulated ends includes passing the insulated portion of the wire segment through an electrically conductive brush. According to the method, an electrical potential is established on the brush by a power source. The method also includes determining a value of electrical current that is conducted through the wire segment by the brush when the potential is established on the brush. The method additionally includes comparing the value of electrical current conducted through the wire segment with a predetermined current value to thereby evaluate the wire segment.

The method may also include accepting the wire segment if the electrical current conducted through the wire segment is at a value that is equal to or less than the predetermined current value, and rejecting the wire segment if the electrical current conducted through the wire segment is at a value that is greater than the predetermined current value. The method may additionally include directing the accepted wire segment to a first area and directing the rejected wire segment to a second area.

According to the method, the acts of directing the accepted wire segment to a first area and directing the rejected wire segment to a second area may be accomplished via the conveyor. Additionally, each of the acts of determining the value of electrical current that is passed through the wire segment, comparing the value of electrical current conducted through the wire segment with the predetermined current value, accepting and rejecting the wire segment, and directing the wire segment via the moveable door may be executed by a controller.

The power source may be DC type, and the electrical potential established on the brush may be equal to or greater than approximately 500 volts. Also, the wire segment may be characterized by one of a U-shape and a W-shape. Additionally, the brush may include two opposing non-contacting bristle portions on which the electrical potential is established by the power source, and between which the insulated portion of the wire segment is passed.

Furthermore, according to the method, the act of passing the insulated portion of the wire segment through the brush may be accomplished via an automated device.

A system for evaluating an electrically conductive wire segment is also disclosed.

The above features and advantages and other features and advantages of the present invention are readily apparent from the following detailed description of the best modes for carrying out the invention when taken in connection with the accompanying drawings.

DETAILED DESCRIPTION

Figures 1, 2:
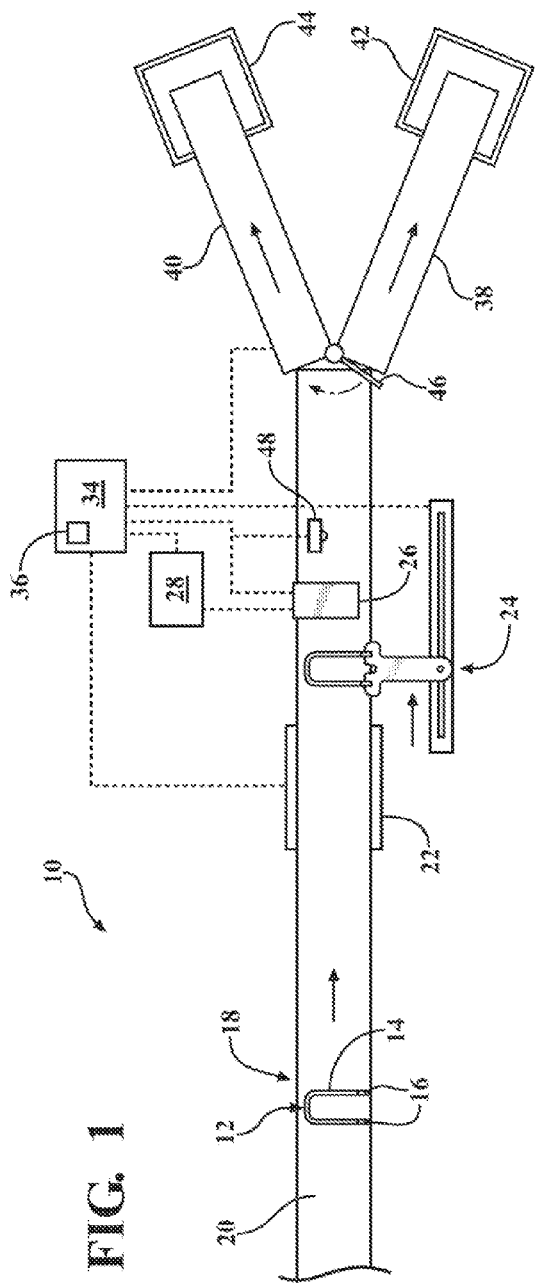
FIG. 1 is a schematic illustration of a system for evaluating an electrically conductive wire segment.
FIG. 2 is a schematic illustration of a possible configuration of the wire segment that may be evaluated by the system shown in FIG. 1.

Referring to the drawings, wherein like reference numbers refer to like components, FIG. 1 shows a system 10 for evaluating or inspecting an electrically conductive wire segment 12. The wire segment 12 as shown is characterized by a U-shape. Although the system 10 will be described herein as evaluating the U-shaped wire segment 12, the system 10 is equally capable of evaluating a wire segment having an otherwise curved or bent shape, for example a wire segment 13 characterized by a W-shape, as shown in FIG. 2, or a wire segment that is substantially straight. As shown in each of FIGS. 1 and 2, wire segments 12 and 13 each include an insulated intermediate portion 14 and non-insulated wire ends 16.

Figure 3:
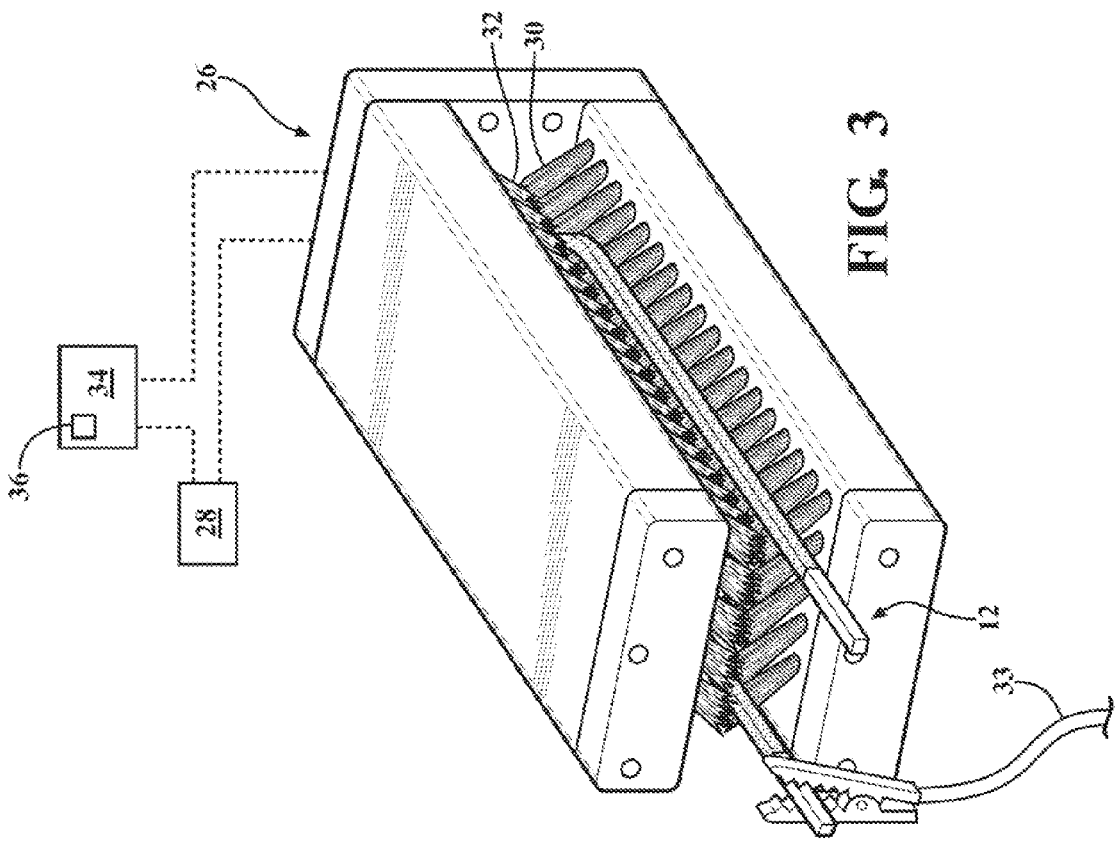
FIG. 3 is a close-up perspective view of an electrically conductive brush with the wire segment shown in FIG. 1 being passed through during the evaluation.

The system 10 includes a conveyor 18 having a moveable track 20, such as a continuous loop of material that may, for example be a belt or a chain rotating about rollers or pulleys (not shown). The conveyor 18 is powered by a motor 22 to shuttle or advance the wire segment 12 toward an automated device 24 such as a robot arm. The automated device 24 is configured to grasp the wire segment 12 and be articulated to orient the wire segment and pass the wire segment through an electrically conductive brush 26. The brush 26 is positioned proximate the conveyor, in line with the track 20. The brush 26 is in electric communication with a power source 28. The power source 28 is configured to establish an electric potential on the brush 26 with respect to the insulated portion 14. As shown in FIG. 3, the brush 26 includes two opposing contacting or non-contacting bristle portions 30 and 32 on which the electrical potential is established by the power source 28, and between which the insulated portion 14 of the wire segment 12 is passed. The wire segment 12 is grounded via an electrical connection 33 when the wire segment is passed through the brush 26. The connection 33 may be incorporated into the automated device 24. After the wire segment 12 is passed through the brush 26, the wire segment may be released by the automated device 24.

Referring back to FIG. 1, the system 10 also includes a controller 34. The controller 34 is programmed to determine a value of electrical current that is conducted through the wire segment 12 when the electrical potential is established on the brush 26 and the insulated portion 14 of the wire segment is passed through the brush. The controller 34 is also programmed with a predetermined current value 36. The controller 34 is additionally programmed to compare the value of electrical current conducted through the wire segment with a predetermined current value 36. The predetermined current value 36 represents a maximum threshold value of the electrical current that may be conducted through the wire segment 12 that has an intact, i.e., not damaged, insulated portion 14. The predetermined current value 36 may be determined empirically, during evaluation and testing of the system 10.

The power source 28 may be a DC type to reduce the energy lost as heat due to the resistance of the wires leading from the power supply 28 to the brush 26. Additionally, the electrical potential established on the brush 26 may be equal to or greater than approximately 500 volts to create a voltage greater than the voltage through the insulated portion 14 of the wire segment 12. The the electrical potential thus established on the brush 26 facilitates the determination of whether the insulated portion is intact.

As shown in FIG. 1, the conveyor 18 includes two distinct tracks 38 and 40. The tracks 38 and 40 may be powered by the motor 22 or by a separate motor (not shown). The tracks 38 and 40 are positioned such that one end of each of the tracks 38 and 40 is adjacent the track 20, and the other end of the track 38 is positioned at or over a designated first area 42, while the other end of the track 40 is positioned at or over a designated second area 44. The designated first and second areas 42, 44 may each include a respective receptacle bin. The tracks 38 and 40 may also be positioned on a grade, such that the wire segment 12 may traverse the tracks 38 and 40 in response to the force of gravity subsequent to being passed through the brush 26 and being released by the automated device 24.

The controller 34 is programmed to accept, i.e., identify or designate as acceptable for its intended application, a wire segment through which electrical current was conducted at a value that is equal to or less than the predetermined current value 36. The controller 34 is also programmed to reject, i.e., identify or designate as not acceptable for its intended application, a wire segment through which electrical current was conducted at a value that is greater than the predetermined current value. The controller 34 may be additionally programmed to regulate a moveable or swinging door 46. With the aid of the door 46, the controller may direct the wire segment 12 to the first area 42, if the wire segment was accepted, and to direct the wire segment to the second area 44, if the wire segment was rejected. The first and second areas 42, 44 may be chosen arbitrarily, and would therefore be fully interchangeable for the purposes of collecting either the accepted or the rejected wire segments.

As shown in FIG. 1, in order to designate the wire segment 12 as either acceptable or not acceptable for its intended application, the system 10 may additionally include a paint marking device 48 for marking the wire segment 12 after the wire segment is passed through the brush 26. The controller 34 may be programmed to automatically regulate the paint marking device 48 to mark the wire segment 12 in response to how the value of the electric current conducted through the wire segment compares with the predetermined current value 36. Whether the wire segment 12 is marked when it is accepted or when it is not accepted may be chosen according to a particular identification and/or marking convention in place at the facility where the system 10 is used.

Figure 4:
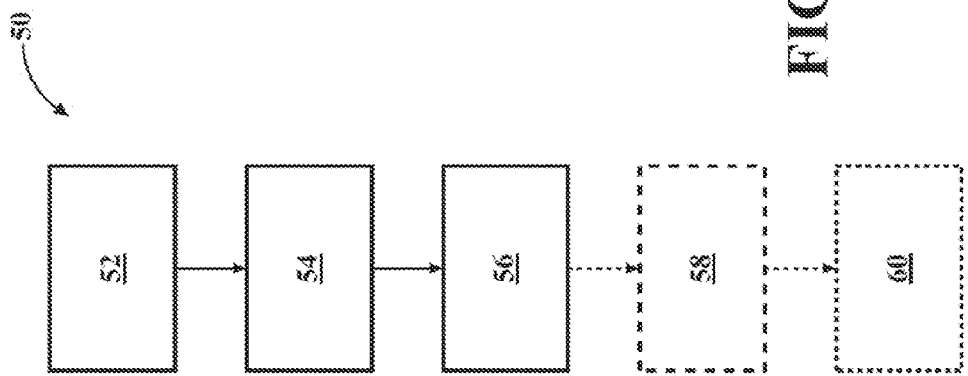
FIG. 4 is a flow diagram of a method of evaluating the wire segment utilizing the system of FIG. 1.

FIG. 4 depicts a method 50 of evaluating the wire segment 12 as described with respect to FIG. 1. Accordingly, the method commences in frame 52, where it includes passing the insulated portion 14 of the wire segment through the brush 26, while an electrical potential is established on the brush and the power source 28. Following frame 52, the method proceeds to frame 54, where it includes determining a value of electrical current that is conducted through the wire segment 12 by the brush 26. After the determination of the electrical current conducted through the wire segment 12 is made, the method advances to frame 56, where it includes comparing the value of the electrical current conducted through the wire segment 12 with the predetermined current value 36.

Following frame 56, the method may proceed to frame 58, where it includes accepting the wire segment 12 if the electrical current conducted there through is at a value that is equal to or less than the predetermined current value 36. Additionally, in frame 56, the method includes rejecting the wire segment if the electrical current conducted there through is at a value that is greater than the predetermined current value 36. As described with respect to FIG. 1 above, the controller 34 may be programmed to mark the wire segment 12 via the paint marking device 48, to thereby identify the wire segment as accepted or rejected.

After frame 58, the method may advance to frame 60, where it includes directing the wire segment 12 to the first area 42, if the wire segment was accepted, and directing the wire segment 12 to the second area 44, if the wire segment was rejected. As described above, the act of directing an accepted wire segment 12 to the first area 42, or directing a rejected wire segment 12, to the second area 44 may be accomplished via the moveable door 46. According to the method, the controller 34 may inspect wire segments continuously at the rate the wire segments are advanced by the conveyor 18 to the automated device 24, and the automated device is capable of passing each wire segment through the brush 26.

While the best modes for carrying out the invention have been described in detail, those familiar with the art to which this invention relates will recognize various alternative designs and embodiments for practicing the invention within the scope of the appended claims.

The invention claimed is:

1. A method of evaluating an electrically conductive wire segment having an insulated intermediate portion and non-insulated ends, comprising:
   passing the insulated intermediate portion of the wire segment through an electrically conductive brush, wherein an electrical potential is established on the brush by a power source;
   determining a value of electrical current that is conducted through the wire segment by the brush; and
   comparing the value of electrical current conducted through the wire segment with a predetermined current value to thereby evaluate the wire segment.

2. The method of claim 1, further comprising accepting the wire segment if the electrical current conducted through the wire segment is at a value that is equal to or less than the predetermined current value, and rejecting the wire segment if the electrical current conducted through the wire segment is at a value that is greater than the predetermined current value.

3. The method of claim 2, further comprising directing the accepted wire segment to a first area and directing the rejected wire segment to a second area.

4. The method of claim 3, wherein said directing the accepted wire segment to a first area and said directing the rejected wire segment to a second area are accomplished via a moveable door.

5. The method of claim 4, wherein each of said determining the value of electrical current that is conducted through the wire segment, said comparing the value of electrical current conducted through the wire segment with the predetermined current value, said accepting and rejecting the wire segment, and said directing the wire segment via the moveable door is executed by a controller.

6. The method of claim 1, wherein the power source is DC type.

7. The method of claim 6, wherein the electrical potential established on the brush is equal to or greater than approximately 500 volts.

8. The method of claim 1, wherein the wire segment is characterized by one of a U-shape and a W-shape.

9. The method of claim 1, wherein the brush includes two opposing bristle portions on which the electrical potential is established by the power source, and wherein said passing the insulated intermediate portion of the wire segment includes passing the insulated intermediate portion between the two opposing bristle portions.

10. The method of claim 1, wherein passing the insulated portion of the wire segment through the brush is accomplished via an automated device.

11. A system for evaluating an electrically conductive wire segment having an insulated intermediate portion and non-insulated ends, comprising:
    an electrically conductive brush;
    a power source configured to establish an electrical potential on the brush;
    a controller programmed to:
        determine a value of electrical current that is conducted through the wire segment when the electrical potential is established on the brush and the insulated intermediate portion of the wire segment is passed through the brush; and
        compare the value of electrical current conducted through the wire segment with a predetermined current value to thereby evaluate the wire segment.

12. The system of claim 11, wherein the controller is additionally programmed to accept the wire segment if the electrical current conducted through the wire segment is at a value that is equal to or less than the predetermined current value, and to reject the wire segment if the electrical current conducted through the wire segment is at a value that is greater than the predetermined current-value.

13. The system of claim 12, wherein the controller is additionally programmed to direct the accepted wire segment to a first area and to direct the rejected wire segment to a second area.

14. The system of claim 13, wherein the controller regulates a moveable door to direct the accepted wire segment to the first area and to direct the rejected wire segment to the second area.

15. The system of claim 11, wherein the power source is DC type.

16. The system of claim 15, wherein the electrical potential established on the brush is equal to or greater than approximately 500 volts.

17. The system of claim 11, wherein the wire segment is characterized by one of a U-shape and a W-shape.

18. The system of claim 11, wherein the brush includes two opposing bristle portions on which the electrical potential is established by the power source, and between which the insulated portion of the wire segment is passed.

19. The system of claim 11, further comprising an automated device, wherein the controller is additionally programmed to regulate the automated device to pass the insulated portion of the wire segment through the brush.

* * * * *